US005216722A

United States Patent [19]

Popovich

[11] Patent Number: 5,216,722

[45] Date of Patent: Jun. 1, 1993

[54] MULTI-CHANNEL ACTIVE ATTENUATION SYSTEM WITH ERROR SIGNAL INPUTS

[75] Inventor: Steven R. Popovich, Stoughton, Wis.

[73] Assignee: Nelson Industries, Inc., Stoughton, Wis.

[21] Appl. No.: 794,115

[22] Filed: Nov. 15, 1991

[51] Int. Cl.$^5$ ............................................ H03B 29/00

[52] U.S. Cl. ........................................ 381/71; 381/94

[58] Field of Search .................................. 381/71, 94

[56] References Cited

U.S. PATENT DOCUMENTS

| | | |
|---|---|---|
| 4,677,676 | 6/1987 | Eriksson . |
| 4,677,677 | 6/1987 | Eriksson . |
| 4,736,431 | 4/1988 | Allie et al. . |
| 4,815,139 | 3/1989 | Eriksson et al. . |
| 4,837,834 | 6/1989 | Allie . |
| 4,987,598 | 1/1991 | Eriksson . |
| 5,105,377 | 4/1992 | Ziegler, Jr. . |

OTHER PUBLICATIONS

"Active Adaptive Sound Control In a Duct: A Computer Simulation", J. C. Burgess, Journal of Acoustic Society of America, 70(3), Sep. 1981, pp. 715–726.

"An Adaptive Algorithm For IIR Filters Used In Multichannel Active Sound Control Systems", Elliott et al., Institute of Sound and Vibration Research Memo No. 681, University of Southampton, Feb. 1988.

"Development Of The Filtered-U Algorithm For Active Noise Control", L. J. Eriksson, Journal of Acoustic Society of America, 89(1), Jan. 1991, pp. 257–265.

*Primary Examiner*—Jin F. Ng

*Assistant Examiner*—Edward Lefkowitz

*Attorney, Agent, or Firm*—Andrus, Sceales, Starke & Sawall

[57] ABSTRACT

A multi-channel active acoustic attenuation system for attenuating a correlated input acoustic wave has one or more output transducers introducing one or more respective canceling acoustic waves to attenuate the input acoustic wave and yield an attenuated output acoustic wave, one or more error transducers sensing the output acoustic wave and providing one or more error signals, and a plurality of adaptive filter channel models. Each channel model has a model input from a respective error transducer. One or more of the channel models also has a model input from at least one of the remaining channel models. Each channel model has an error input from one or more of the error transducers. Each channel model has a model output outputting a correction signal to a respective output transducer to introduce the respective canceling acoustic wave. The correction signal from one or more of the model outputs is also input to the model input of one or more of the remaining channel models.

12 Claims, 7 Drawing Sheets

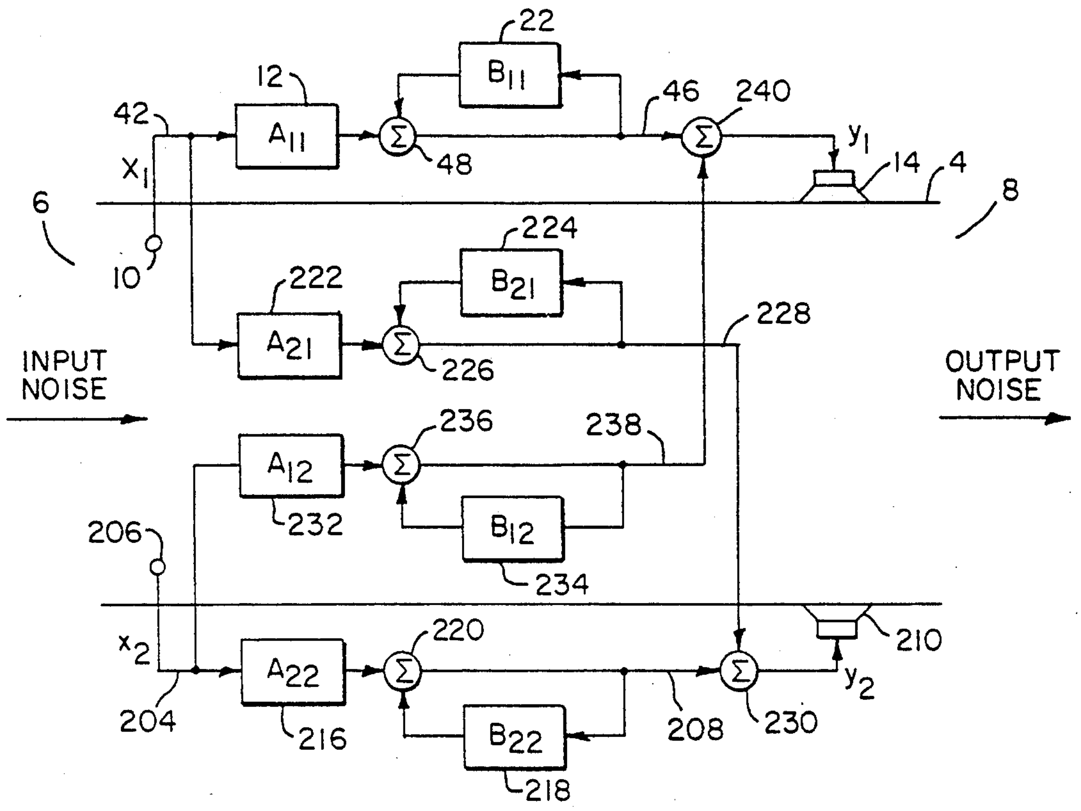
FIG. 6
PRIOR ART
FIG. 7
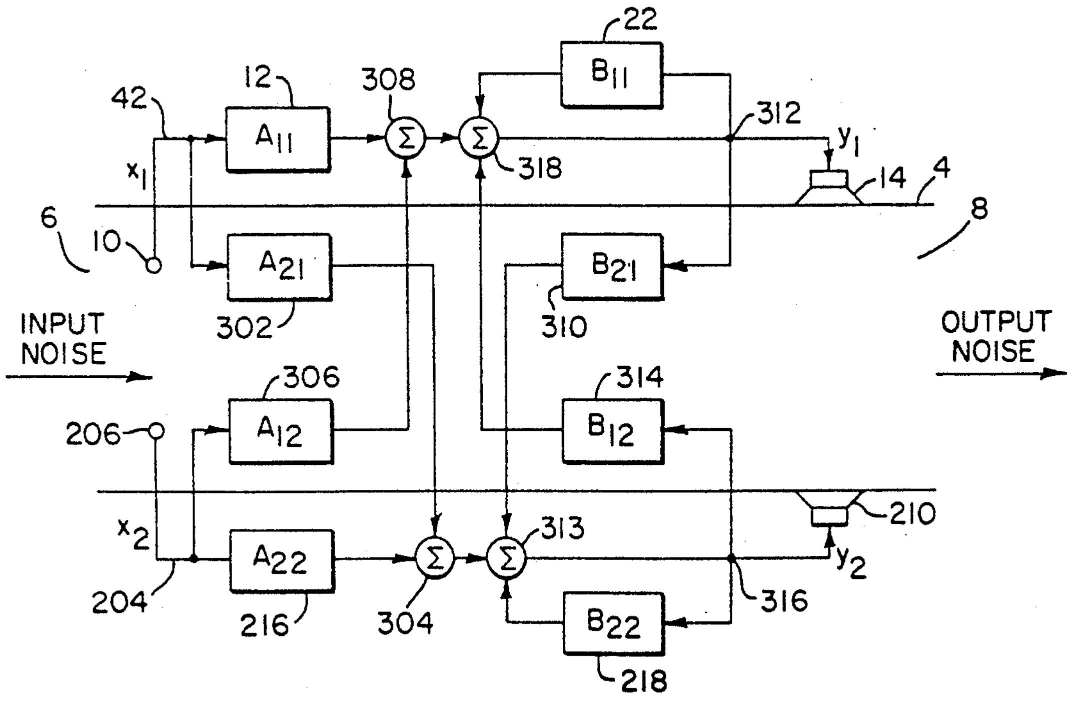

MULTI-CHANNEL ACTIVE ATTENUATION SYSTEM WITH ERROR SIGNAL INPUTS

BACKGROUND AND SUMMARY

The invention relates to active acoustic attenuation systems, and more particularly to a multi-channel system for a correlated input acoustic wave. Correlated means periodic, band-limited, or otherwise having some predictability. The invention arose during continuing development efforts relating to the subject matter shown and described in commonly owned co-pending application Ser. No. 07/691,557, filed Apr. 25, 1991, incorporated herein by reference.

The invention of the noted co-pending application arose during continuing development efforts relating to the subject matter shown and described in U.S. Pat. No. 4,815,139, incorporated herein by reference. The invention of the noted co-pending application also arose during continuing development efforts relating to the subject matter shown and described in U.S. Pat. Nos. 4,677,676, 4,677,677, 4,736,431, 4,837,834, and 4,987,598, and allowed applications Ser. No. 07/388,014, filed Jul. 31, 1989, and Ser. No. 07/464,337, filed Jan. 12, 1990, all incorporated herein by reference.

Active acoustic attenuation or noise control involves injecting a canceling acoustic wave to destructively interfere with and cancel an input acoustic wave. In an active acoustic attenuation system, the output acoustic wave is sensed with an error transducer such as a microphone which supplies an error signal to an adaptive filter control model which in turn supplies a correction signal to a canceling transducer such as a loudspeaker which injects an acoustic wave to destructively interfere with the input acoustic wave and cancel same such that the output acoustic wave or sound at the error microphone is zero or some other desired value.

The invention of the noted co-pending application provides a generalized multi-channel active acoustic attenuation system for attenuating complex sound fields in a duct, large or small, a room, a vehicle cab, or free space. The system may be used with multiple input microphones and/or multiple canceling loudspeakers and/or multiple error microphones, and includes a plurality of adaptive filter channel models, with each channel model being intraconnected to each of the remaining channel models and providing a generalized solution wherein the inputs and outputs of all channel models depend on the inputs and outputs of all other channel models.

The present invention provides a generalized multi-channel active acoustic attenuation system for attenuating complex correlated sound fields in a duct, large or small, a room, a vehicle cab, or free space. The system may be used with multiple canceling loudspeakers and/or multiple error microphones, and includes a plurality of adaptive filter channel models having model inputs and error inputs from error transducers, and model outputs outputting correction signals to output transducers to introduce canceling acoustic waves. The system has numerous applications, including attenuation of audible sound, and vibration control in structures or machines.

BRIEF DESCRIPTION OF THE DRAWINGS

Prior Art

FIG. 6 shows a multi-channel active acoustic attenuation system known in the prior art.

Co-Pending Application

FIG. 7 is a schematic illustration of a multi-channel active acoustic attenuation system in accordance with the invention of above noted co-pending application Ser. No. 07/691,557, filed Apr. 25, 1991.

Figure 8:
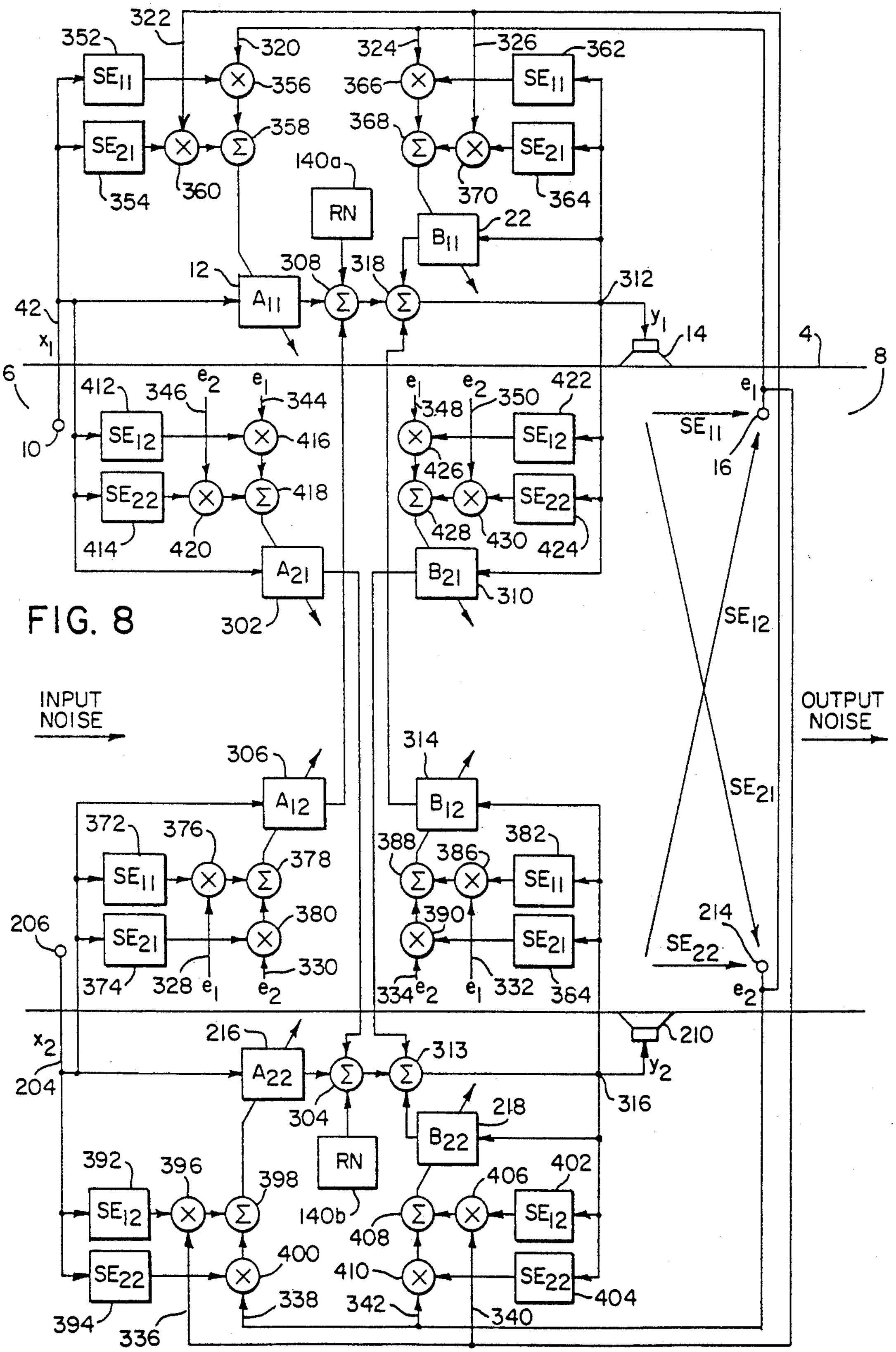

FIG. 8 shows a further embodiment of the system of FIG. 7.

Figure 9:
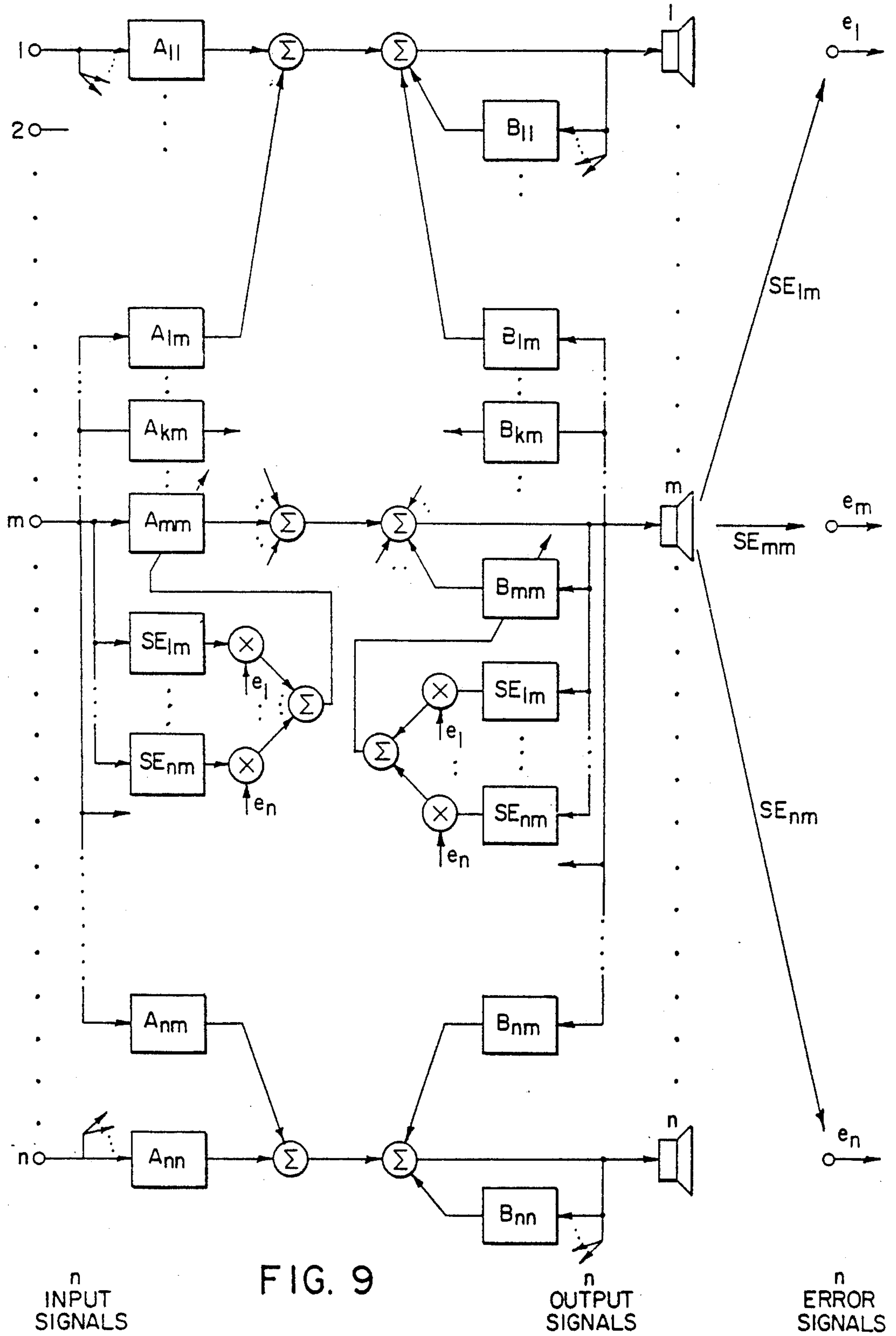

FIG. 9 shows a generalized system.

Present Invention

Figure 10:
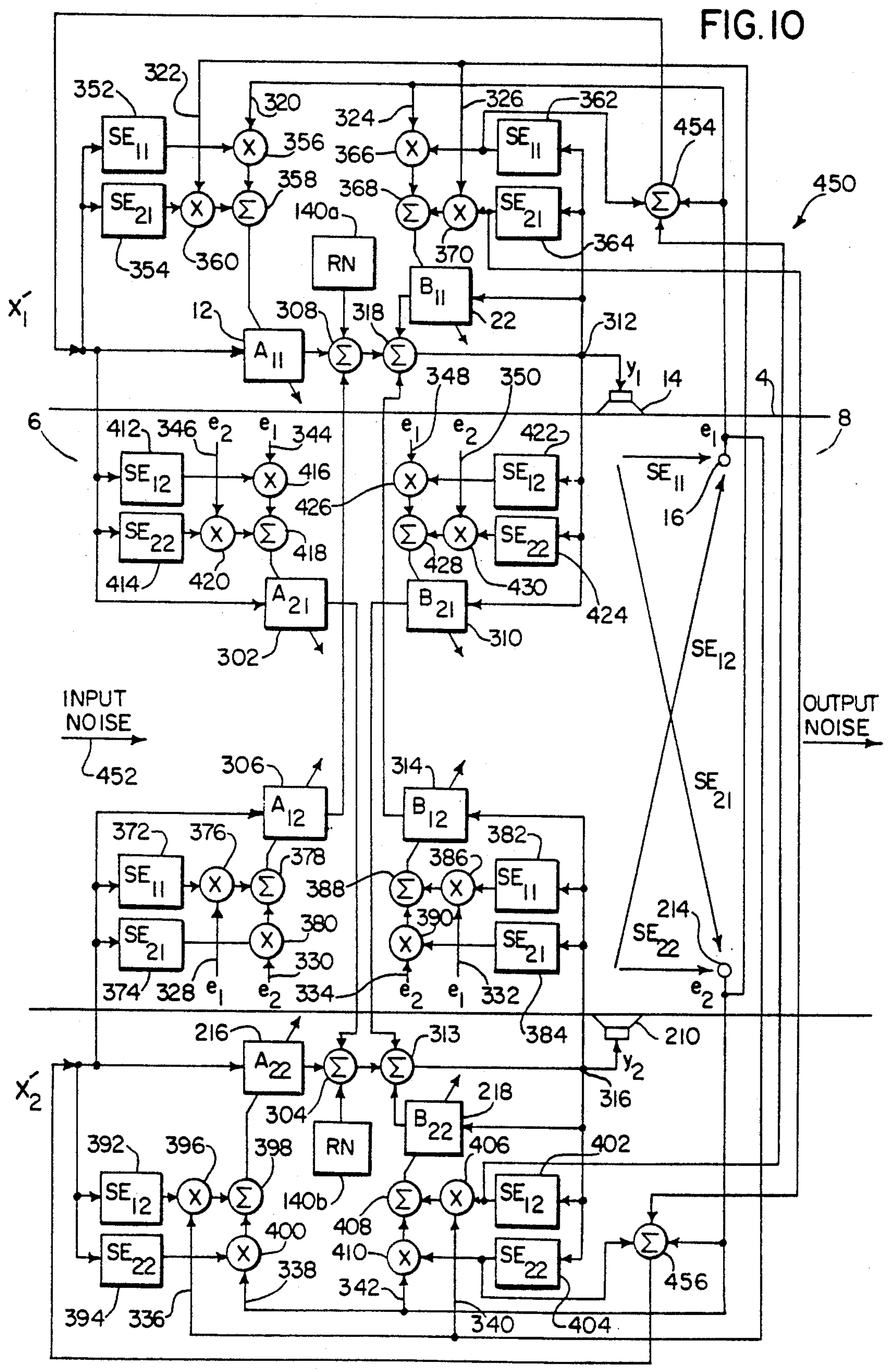

FIG. 10 is a schematic illustration of a multi-channel active acoustic attenuation system in accordance with the present invention.

Figure 11:
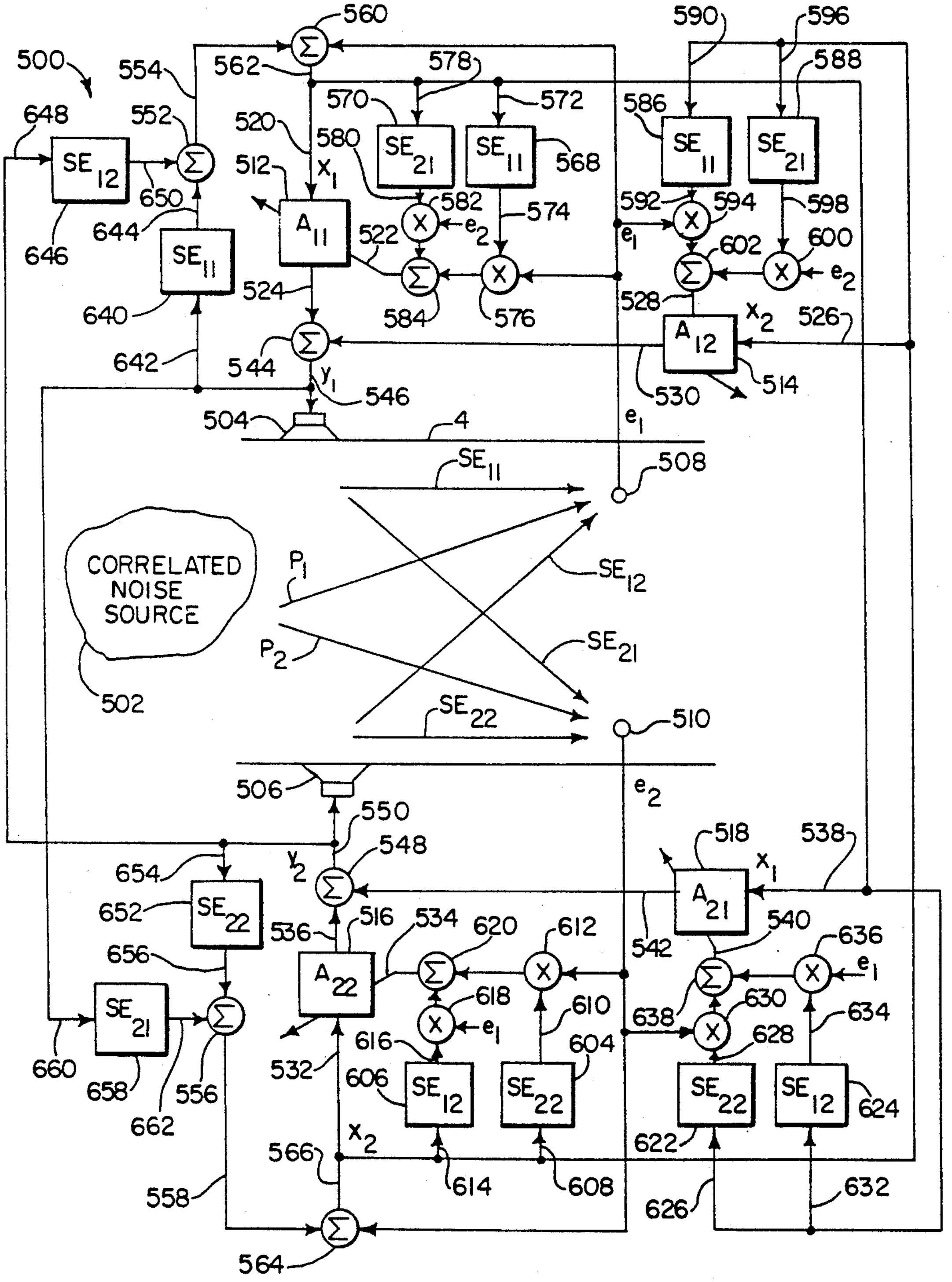

FIG. 11 shows another embodiment of the invention.

DETAILED DESCRIPTION

Prior Art

Figure 1:
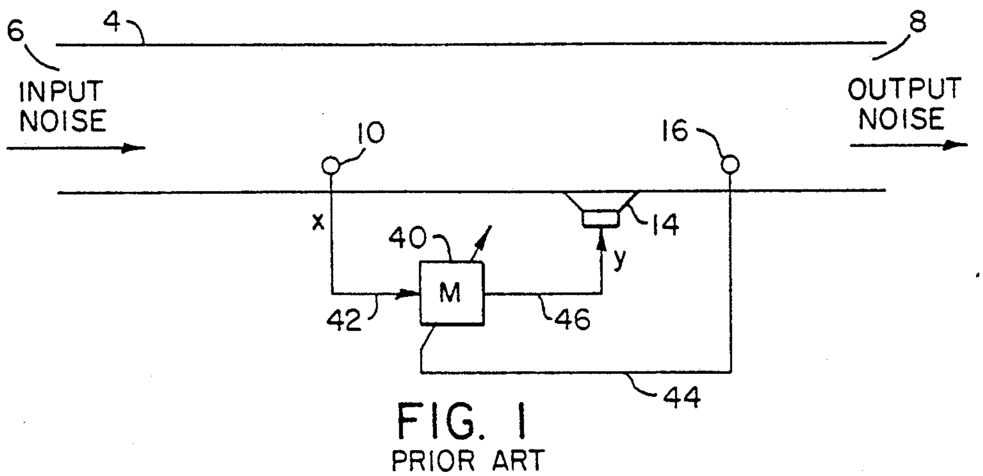
FIG. 1 PRIOR ART
FIG. 1 is a schematic illustration of an active acoustic attenuation system in accordance with above incorporated U.S. Pat. Nos. 4,677,676 and 4,677,677.

FIG. 1 shows an active acoustic attenuation system in accordance with incorporated U.S. Pat. Nos. 4,677,676, and 4,677,677, FIG. 5, and like reference numerals are used from said patents where appropriate to facilitate understanding. For further background, reference is also made to "Development of the Filtered-U Algorithm for Active Noise Control", L. J. Eriksson, Journal of Acoustic Society of America, 89(1), January, 1991, pages 257–265. The system includes a propagation path or environment such as within or defined by a duct or plant 4. The system has an input 6 for receiving an input acoustic wave, e.g., input noise, and an output 8 for radiating or outputting an output acoustic wave, e.g., output noise. An input transducer such as input microphone 10 senses the input acoustic wave. An output transducer such as canceling loudspeaker 14 introduces a canceling acoustic wave to attenuate the input acoustic wave and yield an attenuated output acoustic wave. An error transducer such as error microphone 16 senses the output acoustic wave and provides an error signal at 44. Adaptive filter model M at 40 combined with output transducer 14 adaptively models the acoustic path from input transducer 10 to output transducer 14. Model M has a model input 42 from input transducer 10, an error input 44 from error transducer 16, and a model output 46 outputting a correction signal to output transducer 14 to introduce the canceling acoustic wave. Model M provides a transfer function which when multiplied by its input x yields output y, equation 1.

$$Mx = y \qquad \text{Eq. 1}$$

Figure 2:
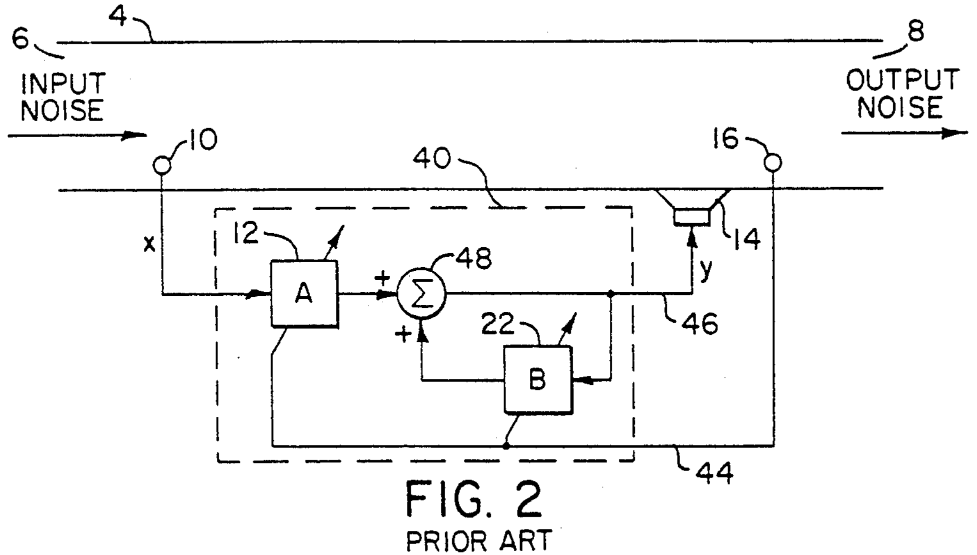
FIG. 2 PRIOR ART
FIG. 2 shows another embodiment of the system of FIG. 1.

As noted in incorporated U.S. Pat. Nos. 4,677,676 and 4,677,677, model M is an adaptive recursive filter having a transfer function with both poles and zeros. Model M is provided by a recursive least mean square, RLMS, filter having a first algorithm provided by LMS filter A at 12, FIG. 2, and a second algorithm provided by LMS filter B at 22. Adaptive model M uses filters A and B combined with output transducer 14 to adaptively model both the acoustic path from input transducer 10 to output transducer 14, and the feedback path from output transducer 14 to input transducer 10. Filter A provides a direct transfer function, and filter B provides a recursive transfer function. The outputs of filters A and B are summed at summer 48, whose output provides the correction signal on line 46. Filter 12 multiplies input signal x by transfer function A to provide the term Ax, equation 2. Filter 22 multiplies its input signal y by transfer function B to yield the term By, equation 2. Summer 48 adds the terms Ax and By to yield a resultant sum y which is the model output correction signal on line 46, equation 2.

$$Ax+By=y \qquad \text{Eq.2}$$

Solving equation 2 for y yields equation 3.

$$y = \frac{A}{1-B}x \qquad \text{Eq. 3}$$

Figure 3:
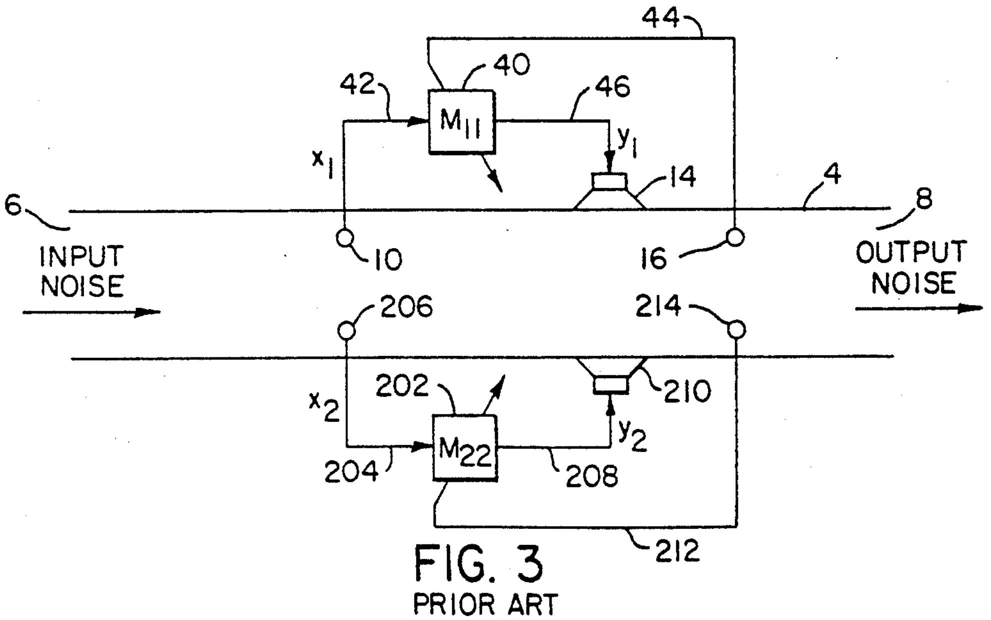
FIG. 3 PRIOR ART
FIG. 3 shows a higher order system in accordance with above incorporated U.S. Pat. No. 4,815,139.

FIG. 3 shows a plural model system including a first channel model $M_{11}$ at 40, comparably to FIG. 1, and a second channel model $M_{22}$ at 202, comparably to FIG. 7 in incorporated U.S. Pat. No. 4,815,139. Each channel model connects a given input and output transducer. Model 202 has a model input 204 from a second input transducer provided by input microphone 206, a model output 208 providing a correction signal to a second output transducer provided by canceling loudspeaker 210, and an error input 212 from a second error transducer provided by error microphone 214. It is also known to provide further models, as shown in incorporated U.S. Pat. No. 4,815,139. Multiple input transducers 10, 206, etc. may be used for providing plural input signals representing the input acoustic wave, or alternatively only a single input signal need be provided and the same such input signal may be input to each of the adaptive filter models. Further alternately, no input microphone is necessary, and instead the input signal may be provided by a transducer such as a tachometer which provides the frequency of a periodic input acoustic wave. Further alternatively, the input signal may be provided by one or more error signals, in the case of a periodic noise source, "Active Adaptive Sound Control In A Duct: A Computer Simulation", J. C. Burgess, Journal of Acoustic Society of America, 70(3), September, 1981, pages 715–726.

Figure 4:
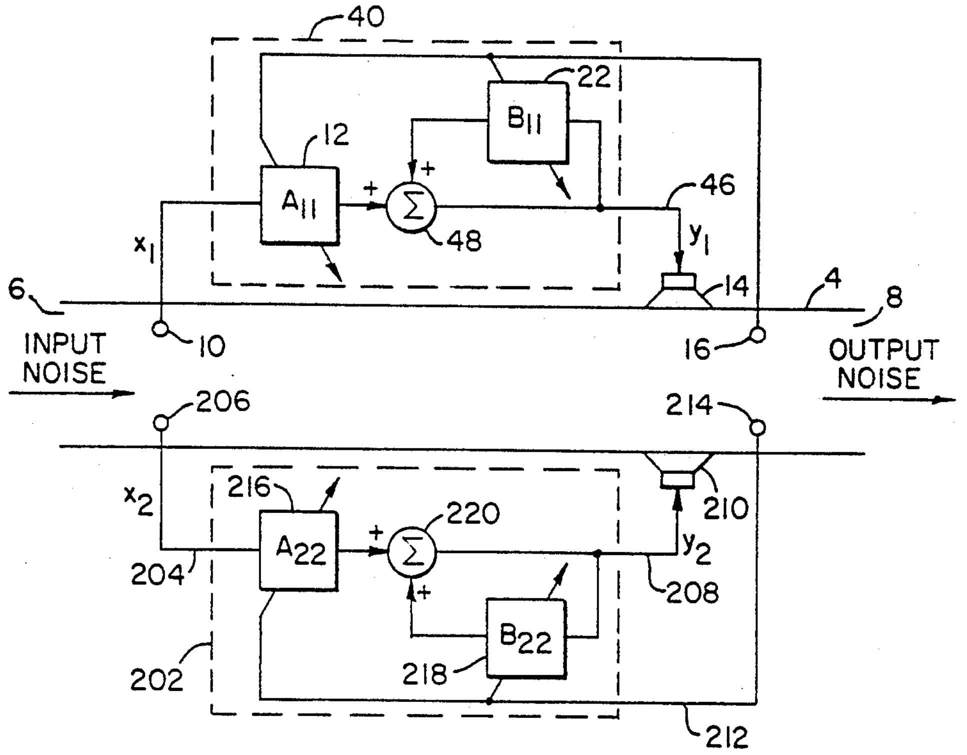
FIG. 4 PRIOR ART
FIG. 4 shows a further embodiment of the system of FIG. 3.

In FIG. 4, each of the models of FIG. 3 is provided by an RLMS adaptive filter model. Model $M_{11}$ includes LMS filter $A_{11}$ at 12 providing a direct transfer function, and LMS filter $B_{11}$ at 22 providing a recursive transfer function The outputs of filters $A_{11}$ and $B_{11}$ are summed at summer 48 having an output providing the correction signal at 46. Model $M_{22}$ includes LMS filter $A_{22}$ at 216 providing a direct transfer function, and LMS filter $B_{22}$ at 218 providing a recursive transfer function. The outputs of filters $A_{22}$ and $B_{22}$ are summed at summer 220 having an output providing the correction signal at 208. Applying equation 3 to the system in FIG. 4 yields equation 4 for $y_1$, and equation 5 for $y_2$.

$$y_1 = \frac{A_1}{1-B_1}x_1 \qquad \text{Eq. 4}$$

$$y_2 = \frac{A_2}{1-B_2}x_2 \qquad \text{Eq. 5}$$

Figure 5:
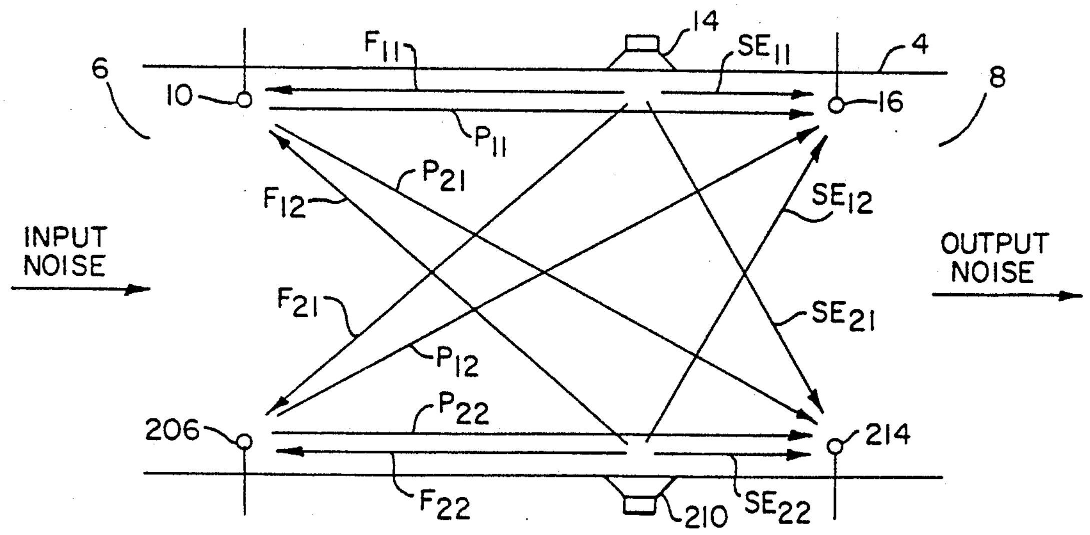
FIG. 5 PRIOR ART
FIG. 5 shows cross-coupled paths in the system of FIG. 4.

FIG. 5 shows cross-coupling of acoustic paths of the system in FIG. 4, including: acoustic path $P_{11}$ to the first error transducer 16 from the first input transducer 10; acoustic path $P_{21}$ to the second error transducer 214 from the first input transducer 10; acoustic path $P_{12}$ to the first error transducer 16 from the second input transducer 206; acoustic path $P_{22}$ to the second error transducer 214 from the second input transducer 206; feedback acoustic path $F_{11}$ to the first input transducer 10 from the first output transducer 14; feedback acoustic path $F_{21}$ to the second input transducer 206 from the first output transducer 14; feedback acoustic path $F_{12}$ to the first input transducer 10 from the second output transducer 210; feedback acoustic path $F_{22}$ to the second input transducer 206 from the second output transducer 210; acoustic path $SE_{11}$ to the first error transducer 16 from the first output transducer 14; acoustic path $SE_{21}$ to the second error transducer 214 from the first output transducer 14; acoustic path $SE_{12}$ to the first error transducer 16 from the second output transducer 210; and acoustic path $SE_{22}$ to the second error transducer 214 from the second output transducer 210.

FIG. 6 is like FIG. 4 and includes additional RLMS adaptive filters for modeling designated cross-coupled paths, for which further reference may be had to "An Adaptive Algorithm For IIR Filters Used In Multichannel Active Sound Control Systems", Elliott et al, Institute of Sound and Vibration Research Memo No. 681, University of Southampton, February 1988. The Elliott et al reference extends the multi-channel system of noted U.S. Pat. No. 4,815,139 by adding further models of cross-coupled paths between channels, and summing the outputs of the models. LMS filter $A_{21}$ at 222 and LMS filter $B_{21}$ at 224 are summed at summer 226, and the combination provides an RLMS filter modeling acoustic path $P_{21}$ and having a model output providing a correction signal at 228 summed at summer 230 with the correction signal from model output 208. LMS filter $A_{12}$ at 232 and LMS filter $B_{12}$ at 234 are summed at summer 236, and the combination provides an RLMS filter modeling acoustic path $P_{12}$ and having a model output at 238 providing a correction signal which is summed at summer 240 with the correction signal from model output 46. Applying equation 3 to the RLMS algorithm filter provided by $A_{11}$, $B_{11}$, FIG. 6, and to the RLMS algorithm filter provided by $A_{12}$, $B_{12}$, yields equation 6.

$$y_1 = \frac{A_{11}}{1-B_{11}}x_1 + \frac{A_{12}}{1-B_{12}}x_2 \qquad \text{Eq. 6}$$

Rearranging equation 6 yields equation 7.

$$y_1 = \frac{A_{11}x_1 - B_{12}A_{11}x_1 + A_{12}x_2 - B_{11}A_{12}x_2}{(1-B_{11})(1-B_{12})} \qquad \text{Eq. 7}$$

Applying equation 3 to the RLMS algorithm filter provided by $A_{21}$, $B_{21}$, FIG. 6, and to the RLMS algorithm filter provided by $A_{22}$, $B_{22}$, yields equation 8.

$$y_2 = \frac{A_{21}}{1 - B_{21}} x_1 + \frac{A_{22}}{1 - B_{22}} x_2 \quad \text{Eq. 8}$$

Rearranging equation 8 yields equation 9.

$$y_2 = \frac{A_{21}x_1 - B_{22}A_{21}x_1 + A_{22}x_2 - B_{21}A_{22}x_2}{(1 - B_{21})(1 - B_{22})} \quad \text{Eq. 9}$$

Co-Pending Application

FIG. 7 is a schematic illustration like FIGS. 4 and 6, but showing the invention of above noted co-pending application Ser. No. 07/691,557, filed Apr. 25, 1991. LMS filter $A_{21}$ at 302 has an input at 42 from 1991. LMS filter first input transducer 10, and an output summed at summer 304 with the output of LMS filter $A_{22}$. LMS filter $A_{12}$ at 306 has an input at 204 from second input transducer 206, and an output summed at summer 308 with the output of LMS filter $A_{11}$. LMS filter $B_{21}$ at 310 has an input from model output 312, and an output summed at summer 313 with the summed outputs of $A_{21}$ and $A_{22}$ and with the output of LMS filter $B_{22}$. Summers 304 and 313 may be common or separate. LMS filter $B_{12}$ at 314 has an input from model output 316, and has an output summed at summer 318 with the summed outputs of $A_{11}$ and $A_{12}$ and the output of LMS filter $B_{11}$. Summers 308 and 318 may be separate or common. FIG. 7 shows a two channel system with a first channel model provided by RLMS filter $A_{11}$, $B_{11}$, and a second channel model provided by RLMS filter $A_{22}$, $B_{22}$, intraconnected with each other and accounting for cross-coupled terms not compensated in the prior art, to be described.

In FIG. 7, the models are intraconnected with each other, to be more fully described, in contrast to FIG. 6 where the models are merely summed. For example, in FIG. 6, model $A_{11}$, $B_{11}$ is summed with model $A_{12}$, $B_{12}$ at summer 240, and model $A_{22}$, $B_{22}$ is summed with model $A_{21}$, $B_{21}$ at summer 230. Summing alone of additional cross-path models, as at 230 and 240 in FIG. 6, does not fully compensate cross-coupling, because the acoustic feedback paths, FIG. 5, each receive a signal from an output transducer that is excited by the outputs of at least two models. In order to properly compensate for such feedback, the total output signal must be used as the input to the recursive model element. In FIG. 6, the signal to each output transducer 14, 210, is composed of the sum of the outputs of several models. However, only the output of each separate model is used as the input to the recursive element for that model, for example $B_{11}$ at 22 receives only the output 46 of the model $A_{11}$, $B_{11}$, even though the output transducer 14 excites feedback path $F_{11}$ using not only the output 46 of model $A_{11}$, $B_{11}$, but also the output 238 of model $A_{12}$, $B_{12}$. The invention of the noted co-pending application addresses and remedies this lack of compensation, and provides a generalized solution for complex sound fields by using intraconnected models providing two or more channels wherein the inputs and outputs of all models depend on the inputs and outputs of all other models.

The invention of the noted co-pending application provides a multi-channel active acoustic attenuation system for attenuating complex input acoustic waves and sound fields. FIG. 7 shows a two channel system with a first channel model $A_{11}$, $B_{11}$, and a second channel model $A_{22}$, $B_{22}$. Additional channels and models may be added. Each of the channel models is intraconnected to each of the remaining channel models. Each channel model has a model input from each of the remaining channel models. The first channel model has an input through transfer function $B_{12}$ at 314 from the output 316 of the second channel model, and has a model input through transfer function $A_{12}$ at 306 from input transducer 206. The second channel model has a model input through transfer function $B_{21}$ at 310 from the output 312 of the first channel model, and has a model input through transfer function $A_{21}$ at 302 from input transducer 10. The correction signal from each channel model output to the respective output transducer is also input to each of the remaining channel models. The input signal to each channel model from the respective input transducer is also input to each of the remaining channel models. The summation of these inputs and outputs, for example at summers 308, 318 in the first channel model, 304, 313 in the second channel model, etc., results in intraconnected channel models.

The correction signal at model output 312 in FIG. 7 applied to output transducer 14 is the same signal applied to the respective recursive transfer function $B_{11}$ at 22 of the first channel model. This is in contrast to FIG. 6 where the correction signal $y_1$ applied to output transducer 14 is not the same signal applied to recursive transfer function $B_{11}$. The correction signal $y_2$ at model output 316 in FIG. 7 applied to output transducer 210 is the same signal applied to recursive transfer function $B_{22}$. In contrast, in FIG. 6 correction signal $y_2$ applied to output transducer 210 is not the same signal applied to recursive transfer function $B_{22}$. Correction signal $y_1$ in FIG. 7 from model output 312 of the first channel model is also applied to recursive transfer function $B_{21}$ of the second channel model, again in contrast to FIG. 6. Likewise, correction signal $y_2$ in FIG. 7 from model output 316 of the second channel model is applied to recursive transfer function $B_{12}$ of the first channel model, again in contrast to FIG. 6.

In FIG. 7, the first channel model has direct transfer functions $A_{11}$ at 12 and $A_{12}$ at 306 having outputs summed With each other at summer 308. The first channel model has a plurality of recursive transfer functions $B_{11}$ at 22 and $B_{12}$ at 314 having outputs summed with each other at summer 318 and summed with the summed outputs of the direct transfer functions from summer 308 to yield a resultant sum at model output 312 which is the correction signal $y_1$. The second channel model has direct transfer functions $A_{22}$ at 216 and $A_{21}$ at 302 having outputs summed with each other at summer 304. The second channel model has a plurality of recursive transfer functions $B_{22}$ at 218 and $B_{21}$ at 310 having outputs summed with each other at summer 313 and summed with the summed outputs of the direct transfer functions from summer 304 to yield a resultant sum at model output 316 which is the correction signal $y_2$. Each noted resultant sum $y_1$, $y_2$, etc., is input to one of the recursive transfer functions of its respective model and is also input to one of the recursive functions of each remaining model.

Applying equation 2 to the system in FIG. 7 for $y_1$ provides product of the transfer function $A_{11}$ times input signal $x_1$ summed at summer 308 with the product of the transfer function $A_{12}$ times the input signal $x_2$ and further summed at summer 318 with the product of the transfer function $B_{11}$ times model output correction signal $y_1$ summed at summer 318 with the product of the transfer function $B_{12}$ times the model output correction signal $y_2$, to yield $y_1$, equation 10.

$$A_{11}x_1+A_{12}x_2+B_{11}y_1+B_{12}y_2=y_1 \quad \text{Eq. 10}$$

Further applying equation 2 to the system in FIG. 7 for $y_2$ provides the product of the transfer function $A_{22}$ times input signal $x_2$ summed at summer 304 with the product of the transfer function $A_{21}$ times input signal $x_1$ and further summed at summer 313 with the product of the transfer function $B_{22}$ times model output correction signal $y_2$ summed at summer 313 with the product of transfer function $B_{21}$ times the model output correction signal $y_1$, to yield $y_2$, equation 11.

$$A_{22}x_2+A_{21}x_1+B_{22}y_2+B_{21}y_1=y_2 \quad \text{Eq. 11}$$

Solving equation for $y_1$ yields equation 12.

$$y_1=\frac{A_{11}x_1+A_{12}x_2+B_{12}y_2}{1-B_{11}} \quad \text{Eq. 12}$$

Solving equation 11 for $y_2$ yields equation 13.

$$y_2=\frac{A_{22}x_2+A_{21}x_1+B_{21}y_1}{1-B_{22}} \quad \text{Eq. 13}$$

Substituting equation 13 into equation 12 yields equation 14.

$$y_1=\frac{A_{11}x_1+A_{12}x_2+B_{12}\left(\frac{A_{22}x_2+A_{21}x_1+B_{21}y_1}{1-B_{22}}\right)}{1-B_{11}} \quad \text{Eq. 14}$$

Rearranging equation 14 yields equation 15.

$$y_1=\frac{A_{11}x_1-B_{22}A_{11}x_1+A_{12}x_2-B_{22}A_{12}x_2+B_{12}A_{22}x_2+B_{12}A_{21}x_1+B_{12}B_{21}y_1}{(1-B_{11})(1-B_{22})} \quad \text{Eq. 15}$$

Solving equation 15 for $y_1$ yields equation 16.

$$y_1=\frac{A_{11}x_1-B_{22}A_{11}x_1+A_{12}x_2-B_{22}A_{12}x_2+B_{12}A_{22}x_2+B_{12}A_{21}x_1}{(1-B_{11})(1-B_{22})-B_{12}B_{21}} \quad \text{Eq. 16}$$

Contrasting the numerators in equations 16 and 7, it is seen that the system compensates numerous cross-coupled terms not compensated in the prior art. The compensation of the additional cross-coupled terms provides better convergence and enhanced stability.

Substituting equation 12 into equation 13 yields equation 17.

$$y_2=\frac{A_{22}x_2+A_{21}x_1+B_{21}\left(\frac{A_{11}x_1+A_{12}x_2+B_{12}y_2}{1-B_{11}}\right)}{1-B_{22}} \quad \text{Eq. 17}$$

Rearranging equation 17 yields equation 18.

$$y_2=\frac{A_{22}x_2-B_{11}A_{22}x_2+A_{21}x_1-B_{11}A_{21}x_1+B_{21}A_{11}x_1+B_{21}A_{12}x_2+B_{21}B_{12}y_2}{(1-B_{22})(1-B_{11})} \quad \text{Eq. 18}$$

Solving equation 18 for $y_2$ yields equation 19.

$$y_2=\frac{A_{22}x_2-B_{11}A_{22}x_2+A_{21}x_1-B_{11}A_{21}x_1+B_{21}A_{11}x_1+B_{21}A_{12}x_2}{(1-B_{22})(1-B_{11})-B_{21}B_{12}} \quad \text{Eq. 19}$$

Comparing equations 19 and 9, it is seen that the system compensates numerous cross-coupled terms not compensated in the prior art. The compensation of the additional cross-coupled terms provides better convergence and enhanced stability.

Each channel model has an error input from each of the error transducers 16, 214, etc., FIG. 8. The system includes the above noted plurality of error paths, including a first set of error paths $SE_{11}$ and $SE_{21}$ between first output transducer 14 and each of error transducers 16 and 214, a second set of error paths $SE_{12}$ and $SE_{22}$ between second output transducer 210 and each error transducers 16 and 214, and so on. Each channel model is updated for each error path of a given set from a given output transducer, to be described.

Each channel model has a first set of one or more model inputs from respective input transducers, and a second set of model inputs from remaining model outputs of the remaining channel models. For example, first channel model $A_{11}$, $B_{11}$ has a first set of model inputs $A_{11}x_1$ and $A_{12}x_2$ summed at summer 308. First channel $A_{11}$, $B_{11}$ has a second set of model inputs $B_{11}y_1$ and $B_{12}y_2$ summed at summer 318. Second channel model $A_{22}$, $B_{22}$ has a first set of model inputs $A_{22}x_2$ and $A_{21}x_1$ summed at summer 304. Second channel model $A_{22}$, $B_{22}$ has a second set of model inputs $B_{22}y_2$ and $B_{21}y_1$ summed at summer 313. Each channel model has first and second algorithm means, A and B, respectively, providing respective direct and recursive transfer functions and each having an error input from each of the error transducers. The first channel model thus has a first algorithm filter $A_{11}$ at 12 having an input from input transducer 10, a plurality of error inputs 320, 322, FIG. 8, one for each of the error transducers 16, 214 and receiving respective error signals $e_1$, $e_2$ therefrom, and an output supplied to summer 308. The first channel model includes a second algorithm filter $B_{11}$ at 22 having an input from correction signal $y_1$ from output 312 of the first channel model to the first output transducer 14, a plurality of error inputs 324, 326, one for each of the error transducers 16, 214 and receiving respective error signals $e_1$, $e_2$ therefrom, and an output supplied to summer 318. Summers 308 and 318 may be separate or joint and receive the outputs of algorithm filters $A_{11}$ and $B_{11}$, and have an output providing correction signal $y_1$ from model output 312 to the first output transducer 14. The first channel model has a third algorithm filter $A_{12}$ at 306 having an input from the second input transducer 206, a plurality of error inputs 328, 330, one for each of the error transducers 16, 214 and receiving respective error signals $e_1$, $e_2$ therefrom, and an output summed at summer 308. The first channel model has a fourth algorithm filter $B_{12}$ at 314 having an input from correction signal $y_2$ from output 316 of the second channel model to the second output transducer 210, a plurality of error inputs 332, 334, one for each of the error transducers 16, 214 and receiving respective error signals $e_1$, $e_2$ therefrom, and an output summed at summer 318.

The second channel model has a first algorithm filter $A_{22}$ at 216 having an input from the second input transducer 206, a plurality of error inputs 336, 338, one for each of the error transducers 16, 214 and receiving respective error signals $e_1$, $e_2$ therefrom, and an output supplied to summer 304. The second channel model has a second algorithm filter $B_{22}$ at 218 having an input from correction signal $y_2$ from output 316 of the second channel model to the second output transducer 210, a plurality of error inputs 340, 342, one for each of the error transducers 16, 214 and receiving respective error signals $e_1$, $e_2$ therefrom, and an output supplied to summer 313. Summers 304 and 313 may be joint or separate and have inputs from the outputs of the algorithm filters 216 and 218, and an output providing correction signal $y_2$ from output 316 of the second channel model to the second output transducer 210. The second channel model includes a third algorithm filter $A_{21}$ at 302 having an input from the first input transducer 10, a plurality of error inputs 344, 346, one for each of the error transducers 16, 214 and receiving respective error signals $e_1$, $e_2$ therefrom, and an output summed at summer 304. The second channel model includes a fourth algorithm filter $B_{21}$ at 310 having an input from correction signal $y_1$ from output 312 of the first channel model to the first output transducer 14, a plurality of error inputs 348, 350, one for each of the error transducers 16, 214 and receiving respective error signals $e_1$, $e_2$ therefrom, and an output summed at summer 313. There are numerous manners of updating the weights of the filters. The preferred manner is that shown in incorporated U.S. Pat. No. 4,677,676, to be described.

Algorithm filter $A_{11}$ at 12 of the first channel model includes a set of error path models 352, 354 of respective error paths $SE_{11}$, $SE_{21}$, which are the error paths between first output transducer 14 and each of error transducers 16 and 214. The error path models are preferably provided using a random noise source as shown at 140 in FIG. 19 of incorporated U.S. Pat. No. 4,677,676, with a copy of the respective error path model provided at 352, 354, etc., as in incorporated U.S. Pat. No. 4,667,676 at 144 in FIG. 19, and for which further reference may be had to the above noted Eriksson article "Development of The Filtered-U Algorithm For Active Noise Control". Each channel model for each output transducer 14, 210 has its own random noise source 140*a*, 140*b*. Alternatively, the error path may be modeled without a random noise source as in incorporated U.S. Pat. No. 4,987,598. It is preferred that the error path modeling include modeling of both the transfer function of speaker 14 and the acoustic path from such speaker to the error microphones, though the SE model may include only one of such transfer functions, for example if the other transfer function is relatively constant. Error path model 352 has an input from input signal $x_1$ from first input transducer 10, and an output multiplied at multiplier 356 with error signal $e_1$ from the first error transducer 16 to provide a resultant product which is summed at summing junction 358. Error path model 354 has an input from first input transducer 10, and an output multiplied at multiplier 360 with error signal $e_2$ from the second error transducer 214 to provide a resultant product which is summed at summing junction 358. The output of summing junction 358 provides a weight update to algorithm filter $A_{11}$ at 12.

The second algorithm filter $B_{11}$ at 22 of the first channel model includes a set of error path models 362, 364 of respective error paths $SE_{11}$, $SE_{21}$ between first output transducer 16 and each of error transducers 16, 214. Error path model 362 has an input from correction signal $y_1$ from output 312 of the first channel model applied to first output transducer 14. Error path model 362 has an output multiplied at multiplier 366 with error signal $e_1$ from first error transducer 16 to provide a resultant product which is summed at summing junction 368. Error path model 364 has an input from correction signal $y_1$ from output 312 of the first channel model applied to the first output transducer 14. Error path model 364 has an output multiplied at multiplier 370 with error signal $e_2$ from second error transducer 214 to provide a resultant product which is summed at summing junction 368. The output of summing junction 368 provides a weight update to algorithm filter $B_{11}$ at 22.

The third algorithm filter $A_{12}$ at 306 of the first channel model includes a set of error path models 372, 374 of respective error paths $SE_{11}$, $SE_{21}$ between first output transducer 14 and each of error transducers 16, 214. Error path model 372 has an input from input signal $x_2$ from second input transducer 206, and an output multiplied at multiplier 376 with error signal el from first error transducer 16 to provide a resultant product which is summed at summing junction 378. Error path model 374 has an input from input signal $x_2$ from first input transducer 206, and an output multiplied at multiplier 380 with error signal $e_2$ from second error transducer 214 to provide a resultant product which is summed at summing junction 378. The output of summing junction 378 provides a weight update to algorithm filter $A_{12}$ at 306.

The fourth algorithm filter $B_{12}$ at 314 of the first channel model includes a set of error path models 382, 384 of respective error paths $SE_{11}$, $SE_{21}$ between first output transducer 14 and each of error transducers 16, 214. Error path model 382 has an input from correction signal $y_2$ from output 316 of the second channel model applied to second output transducer 210. Error path model 382 has an output multiplied at multiplier 386 with error signal $e_1$ from first error transducer 16 to provide a resultant product which is summed at summing junction 388. Error path model 384 has an input from correction signal $y_2$ from output 316 of the second channel model applied to the second output transducer 210. Error path model 384 has an output multiplied at multiplier 390 with error signal $e_2$ from second error transducer 214 to provide a resultant product which is summed at summing junction 388. The output of summing junction 388 provides a weight update to algorithm filter $B_{12}$ at 314.

The first algorithm filter $A_{22}$ at 216 of the second channel model includes a set of error path models 392, 394 of respective error paths $SE_{12}$, $SE_{22}$ between second output transducer 210 and each of error transducers 16, 214. Error path model 392 has an input from input signal $x_2$ from second input transducer 206, and an output multiplied at multiplier 396 with error signal $e_1$ from first error transducer 16 to provide a resultant product which is summed at summing junction 398. Error path model 394 has an input from input signal $x_2$ from second input transducer 206, and an output multiplied at multiplier 400 with error signal $e_2$ from second error transducer 214 to provide a resultant product which is summed at summing junction 398. The output of summing junction 398 provides a weight update to algorithm filter $A_{22}$ at 216.

The second algorithm filter $B_{22}$ at 218 of the second channel model includes a set of error path models 402, 404 of respective error paths $SE_{12}$, $SE_{22}$ between second output transducer 210 and each of error transducers 16, 214. Error path model 402 has an input from correction signal $y_2$ from output 316 of the second channel model applied to the second output transducer 210. Error path model 402 has an output multiplied at multiplier 406 with error signal $e_1$ from first error transducer 16 to provide a resultant product which is summed at summing junction 408. Error path model 404 has an input from correction signal $y_2$ from output 316 of the second channel model applied to the second output transducer 210. Error path model 404 has an output multiplied with error signal $e_2$ at multiplier 410 to provide a resultant product which is summed at summing junction 408. The output of summing junction 408 provides a weight update to algorithm filter $B_{22}$ at 218.

The third algorithm filter $A_{21}$ at 302 of the second channel model includes a set of error path models 412, 414 of respective error paths $SE_{12}$, $SE_{22}$ between second output transducer 210 and each of error transducers 16, 214. Error path model 412 has an input from input signal $x_1$ from first input transducer 10, and an output multiplied at multiplier 416 with error signal $e_1$ to provide a resultant product which is summed at summing junction 418. Error path model 414 has an input from input signal $x_1$ from first input transducer 10, and an output multiplied at multiplier 420 with error signal $e_2$ from second error transducer 214 to provide a resultant product which is summed at summing junction 418. The output of summing junction 418 provides a weight update to algorithm filter $A_{21}$ at 302.

The fourth algorithm filter $B_{21}$ at 310 of the second channel model includes a set of error path models 422, 424 of respective error paths $SE_{12}$, $SE_{22}$ between second output transducer 210 and each of error transducers 16, 214. Error path model 422 has an input from correction signal $y_1$ from output 312 of the first channel model applied to the first output transducer 14. Error path model 422 has an output multiplied at multiplier 426 with error signal $e_1$ from first error transducer 16 to provide a resultant product which is summed at summing junction 428. Error path model 424 has an input from correction signal $y_1$ from output 312 of the first channel model applied to the first output transducer 14. Error path model 424 has an output multiplied at multiplier 430 with error signal $e_2$ from the second error transducer 214 to provide a resultant product which is summed at summing junction 428. The output of summing junction 428 provides a weight update to algorithm filter $B_{21}$ at 310.

The invention of the noted co-pending application is not limited to a two channel system, but rather may be expanded to any number of channels. FIG. 9 shows the generalized system for n input signals from n input transducers, n output signals to n output transducers, and n error signals from n error transducers, by extrapolating the above two channel system. FIG. 9 shows the $m^{th}$ input signal from the $m^{th}$ input transducer providing an input to algorithm filter $A_{1m}$ through $A_{km}$ through $A_{mm}$ through $A_{nm}$. Algorithm filter $A_{mm}$ is updated by the weight update from the sum of the outputs of respective error path models $SE_{1m}$ through $SE_{nm}$ multiplied by respective error signals $e_1$ through $e_n$. Algorithm filter $A_{km}$ is updated by the weight update from the sum of the outputs of respective error path models $SE_{1k}$ through $SE_{nk}$ multiplied by respective error signals $e_1$ through $e_n$. The model output correction signal to the $m^{th}$ output transducer is applied to filter model $B_{1m}$, which is the recursive transfer function in the first channel model from the $m^{th}$ output transducer, and so on through $B_{km}$ through $B_{mm}$ through $B_{nm}$. Algorithm filter $B_{mm}$ is updated by the weight update from the sum of the outputs of respective SE error path models $SE_{1m}$ through $SE_{nm}$ multiplied by respective error signals $e_1$ through $e_n$. Algorithm filter $B_{km}$ is updated by the weight update from the sum of the outputs of respective error path models $SE_{1k}$ through $SE_{nk}$ multiplied by respective error signals $e_1$ through $e_n$. The system provides a multi-channel generalized active acoustic attenuation system for complex sound fields. Each of the multiple channel models is intraconnected with all other channel models. The inputs and outputs of all channel models depend on the inputs and outputs of all other channel models. The total signal to the output transducers is used as an input to all other channel models. All error signals, e.g., $e_1 \ldots e_n$, are used to update each channel.

It is preferred that each channel has its own input transducer, output transducer, and error transducer, though other combinations are possible. For example, a first channel may be the path from a first input transducer to a first output transducer, and a second channel may be the path from the first input transducer to a second output transducer. Each channel has a channel model, and each channel model is intraconnected with each of the remaining channel models, as above described. The system is applicable to one or more input transducers, one or more output transducers, and one or more error transducers, and at a minimum includes at least two input signals or at least two output transducers. One or more input signals representing the input acoustic wave providing the input noise at 6 are provided by input transducers 10, 206, etc., to the adaptive filter models. Only a single input signal need be provided, and the same such input signal may be input to each of the adaptive filter models. Such single input signal may be provided by a single input microphone, or alternatively the input signal may be provided by a transducer such as a tachometer which provides the frequency of a periodic input acoustic wave such as from an engine or the like. Further alternatively, the input signal may be provided by one or more error signals, as above noted, in the case of a periodic noise source, "Active Adaptive Sound Control In A Duct: A Computer Simulation", J. C. Burgess, Journal of Acoustic Society of America, 70(3), September 1981, pages 715–726. The system includes a propagation path or environment such as within or defined by a duct or plant 4, though the environment is not limited thereto and may be a room, a vehicle cab, free space, etc. The system has other applications such as vibration control in structures or machines, wherein the input and error transducers are accelerometers for sensing the respective acoustic waves, and the output transducers are shakers for outputting canceling acoustic waves. An exemplary application is active engine mounts in an automobile or truck for damping engine vibration. The system is also applicable to complex structures for controlling vibration. In general, the system may be used for attenuation of an undesired elastic wave in an elastic medium, i.e. an acoustic wave propagating in an acoustic medium.

Present Invention

FIG. 10 is an illustration like FIG. 8 and shows the present invention, and like reference numerals are used where appropriate to facilitate understanding. Multichannel active acoustic attenuation system 450 attenuates one or more correlated input acoustic waves as shown at input noise 452. Correlated means periodic, band-limited, or otherwise having some predictability. The system includes one or more output transducers, such as canceling loudspeakers 14, 210, introducing one or more respective canceling acoustic waves to attenuate the input acoustic wave and yield an attenuated output acoustic wave. This system includes one or more error transducers, such as error microphones 16, 214, sensing the output acoustic wave and providing respective error signals $e_1$, $e_2$. Each channel model has an error input from each of the error transducers 16, 214, etc. The system includes the above noted plurality of error paths, including a first set of error paths $SE_{11}$ and $SE_{21}$ between first output transducer 14 and each of error transducers 16 and 214, a second set of error paths $SE_{12}$ and $SE_{22}$ between second output transducer 210 and each of error transducers 16 and 214, and so on. Each channel model is updated for each error path of a given set from a given output transducer, to be described.

Each channel model has a first set of one or more model inputs from respective error transducers, and a second set of model inputs from remaining model outputs of the remaining channel models. For example, first channel model $A_{11}$, $B_{11}$ has a first set of model inputs $A_{11}x_1$ and $A_{12}x_2$ summed at summer 308. Input $x_1$ is provided by the output of summer 454 which has inputs from error path model 362, error path model 402, and error transducer 16. Input $x_2$ is provided by the output of summer 456, which has inputs from error path model 404, error path model 364, and error transducer 214.

First channel model $A_{11}$, $B_{11}$ has a second set of model inputs $B_{11}y_1$ and $B_{12}y_2$ summed at summer 318. Second channel model $A_{22}$, $B_{22}$ has a first set of model inputs $A_{22}x_2$ and $A_{21}x_1$ summed at summer 304. Second channel model $A_{22}$, $B_{22}$ has a second set of model inputs $B_{22}y_2$ and $B_{21}y_1$ summed at summer 313. Each channel model has first and second algorithm means, A and B, respectively, providing respective direct and recursive transfer functions and each having an error input from each of the error transducers. The first channel model thus has a first algorithm filter $A_{11}$ at 12 having an input from input signal $x_1$, a plurality of error inputs 320, 322, one for each of the error transducers 16, 214 and receiving respective error signals $e_1$, $e_2$ therefrom, and an output supplied to summer 308. The first channel model includes a second algorithm filter $B_{11}$ at 22 having an input from correction signal $y_1$ from output 312 of the first channel model to the first output transducer 14, a plurality of error inputs 324, 326, one for each of the error transducers 16, 214 and receiving respective error signals $e_1$, $e_2$ therefrom, and an output supplied to summer 318. Summers 308 and 318 may be separate or joint and receive the outputs of algorithm filters $A_{11}$ and $B_{11}$, and have an output providing correction signal $y_1$ from model output 312 to the first output transducer 14. The first channel model has a third algorithm filter $A_{12}$ at 306 having an input from input signal $x_2$, a plurality of error inputs 328, 330, one for each of the error transducers 16, 214 and receiving respective error signals $e_1$, $e_2$ therefrom, and an output summed at summer 308. The first channel model has a fourth algorithm filter $B_{12}$ at 314 having an input from correction signal $y_2$ from output 316 of the second channel model to the second output transducer 210, a plurality of error inputs 332, 334, one for each of the error transducers 16, 214 and receiving respective error signals $e_1$, $e_2$ therefrom, and an output summed at summer 318.

The second channel model has a first algorithm filter $A_{22}$ at 216 having an input from input signal $x_2$, a plurality of error inputs 336, 338, one for each of the error transducers 16, 214 and receiving respective error signals $e_1$, $e_2$ therefrom, and an output supplied to summer 304. The second channel model has a second algorithm filter $B_{22}$ at 218 having an input from correction signal $y_2$ from output 316 of the second channel model to the second output transducer 210, a plurality of error inputs 340, 342, one for each of the error transducers 16, 214 and receiving respective error signals $e_1$, $e_2$ therefrom, and an output supplied to summer 313. Summers 304 and 313 may be joint or separate and have inputs from the outputs of the algorithm filters 216 and 218, and an output providing correction signal $y_2$ from output 316 of the second channel model to the second output transducer 210. The second channel model includes a third algorithm filter $A_{21}$ at 302 having an input from input signal $x_1$, a plurality of error inputs 344, 346, one for each of the error transducers 16, 214 and receiving respective error signals $e_1$, $e_2$ therefrom, and an output summed at summer 304. The second channel model includes a fourth algorithm filter $B_{21}$ at 310 having an input from correction signal $y_1$ from output 312 of the first channel model to the first output transducer 14, a plurality of error inputs 348, 350, one for each of the error transducers 16, 214 and receiving respective error signals $e_1$, $e_2$ therefrom, and an output summed at summer 313. There are numerous manners of updating the weights of the filters. The preferred manner is that shown in incorporated U.S. Pat. No. 4,677,676, above described.

Algorithm filter $A_{11}$ at 12 of the first channel model includes a set of error path models 352, 354 of respective error paths $SE_{11}$, $SE_{21}$, which are the error paths between first output transducer 14 and each of error transducers 16 and 214. The error path models are preferably provided using a random noise source as shown at 140 in FIG. 19 of incorporated U.S. Pat. No. 4,677,676, with a copy of the respective error path model provided at 352, 354, etc., as in incorporated U.S. Pat. No. 4,677,676 at 144 in FIG. 19, and for which further reference may be had to the above noted Eriksson article "Development of The Filtered-U Algorithm For Active Noise Control". Each channel model for each output transducer 14, 210 has its own random noise source 140*a*, 140*b*. Alternatively, the error path may be modeled without a random noise source as in incorporated U.S. Pat. No. 4,987,598. It is preferred that the error path modeling include modeling of both the transfer function of speaker 14 and the acoustic path from such speaker to the error microphones, though the SE model may include only one of such transfer functions, for example if the other transfer function is relatively constant. Error path model 352 has an input from input signal $x_1$ and an output multiplied at multiplier 356 with error signal $e_1$ from the first error transducer 16 to provide a resultant product which is summed at summing junction 358. Error path model 354 has an input from input signal $x_1$ and an output multiplied at multiplier 360 with error signal $e_2$ from the second error transducer 214 to provide a resultant product which is summed at summing junction 358. The output of summing junction 358 provides a weight update to algorithm filter $A_{11}$ at 12.

The second algorithm filter $B_{11}$ at 22 of the first channel model includes a set of error path models 362, 364 of respective error paths $SE_{11}$, $SE_{21}$ between first output transducer 16 and each of error transducers 16, 214. Error path model 362 has an input from correction signal $y_1$ from output 312 of the first channel model applied to first output transducer 14. Error path model 362 has an output multiplied at multiplier 366 with error signal $e_1$ from first error transducer 16 to provide a resultant product which is summed at summing junction 368. Error path model 364 has an input from correction signal $y_1$ from output 312 of the first channel model applied to the first output transducer 14. Error path model 364 has an output multiplied at multiplier 370 with error signal $e_2$ from second error transducer 214 to provide a resultant product which is summed at summing junction 368. The output of summing junction 368 provides a weight update to algorithm filter $B_{11}$ at 22.

The third algorithm filter $A_{12}$ at 306 of the first channel model includes a set of error path models 372, 374 of respective error paths $SE_{11}$, $SE_{21}$ between first output transducer 14 and each of error transducers 16, 214. Error path model 372 has an input from input signal $x_2$ and an output multiplied at multiplier 376 with error signal $e_1$ from first error transducer 16 to provide a resultant product which is summed at summing junction 378. Error path model 374 has an input from input signal $x_2$ and an output multiplied at multiplier 380 with error signal $e_2$ from second error transducer 214 to provide a resultant product which is summed at summing junction 378. The output of summing junction 378 provides a weight update to algorithm filter $A_{12}$ at 306.

The fourth algorithm filter $B_{12}$ at 314 of the first channel model includes a set of error path models 382, 384 of respective error paths $SE_{11}$, $SE_{21}$ between first output transducer 14 and each of error transducers 16, 214. Error path model 382 has an input from correction signal $y_2$ from output 316 of the second channel model applied to second output transducer 210. Error path model 382 has an output multiplied at multiplier 386 with error signal $e_1$ from first error transducer 16 to provide a resultant product which is summed at summing junction 388. Error path model 384 has an input from correction signal $y_2$ from output 316 of the second channel model applied to the second output transducer 210. Error path model 384 has an output multiplied at multiplier 390 with error signal $e_2$ from second error transducer 214 to provide a resultant product which is summed at summing junction 388. The output of summing junction 388 provides a weight update to algorithm filter $B_{12}$ at 314.

The first algorithm filter $A_{22}$ at 216 of the second channel model includes a set of error path models 392, 394 of respective error paths $SE_{12}$, $SE_{22}$ between second output transducer 210 and each of error transducers 16, 214. Error path model 392 has an input from input signal $x_2$ and an output multiplied at multiplier 396 with error signal el from first error transducer 16 to provide a resultant product which is summed at summing junction 398. Error path model 394 has an input from input signal $x_2$ and an output multiplied at multiplier 400 with error signal $e_2$ from second error transducer 214 to provide a resultant product which is summed at summing junction 398. The output of summing junction 398 provides a weight update to algorithm filter $A_{22}$ at 216.

The second algorithm filter $B_{22}$ at 218 of the second channel model includes a set of error path models 402, 404 of respective error paths $SE_{12}$, $SE_{22}$ between second output transducer 210 and each of error transducers 16, 214. Error path model 402 has an input from correction signal $y_2$ from output 316 of the second channel model applied to the second output transducer 210. Error path model 402 has an output multiplied at multiplier 406 with error signal $e_1$ from first error transducer 16 to provide a resultant product which is summed at summing junction 408. Error path model 404 has an input from correction signal $y_2$ from output 316 of the second channel model applied to the second output transducer 210. Error path model 404 has an output multiplied with error signal $e_2$ at multiplier 410 to provide a resultant product which is summed at summing junction 408. The output of summing junction 408 provides a weight update to algorithm filter $B_{22}$ at 218.

The third algorithm filter $A_{21}$ at 302 of the second channel model includes a set of error path models 412, 414 of respective error paths $SE_{12}$, $SE_{22}$ between second output transducer 210 and each of error transducers 416, 214. Error path model 412 has an input from input signal $x_1$ and an output multiplied at multiplier 16 with error signal $e_1$ to provide a resultant product which is summed at summing junction 418. Error path model 414 has an input from input signal $x_1$ and an output multiplied at multiplier 420 with error signal $e_2$ from second error transducer 214 to provide a resultant product which is summed at summing junction 418. The output of summing junction 418 provides a weight update to algorithm filter $A_{21}$ at 302.

The fourth algorithm filter $B_{21}$ at 310 of the second channel model includes a set of error path models 422, 424 of respective error paths $SE_{12}$, $SE_{22}$ between second output transducer 210 and each of error transducers 16, 214. Error path model 422 has an input from correction signal $y_1$ from output 312 of the first channel model applied to the first output transducer 14. Error path model 422 has an output multiplied at multiplier 426 with error signal $e_1$ from first error transducer 16 to provide a resultant product which is summed at summing junction 428. Error path model 424 has an input from correction signal $y_1$ from output 312 of the first channel model applied to the first output transducer 14. Error path model 424 has an output multiplied at multiplier 430 with error signal $e_2$ from the second error transducer 214 to provide a resultant product which is summed at summing junction 428. The output of summing junction 428 provides a weight update to algorithm filter $B_{21}$ at 310.

FIG. 11 is an illustration like FIG. 10, and shows a further embodiment. Multi-channel active acoustic attenuation system 500 attenuates one or more correlated input acoustic waves from source 502. Correlated means periodic, band-limited, or otherwise having some predictability. The system includes one or more output transducers, such as canceling loudspeakers 504, 506, introducing one or more respective canceling acoustic waves to attenuate the input acoustic wave and yield an attenuated output acoustic wave. The system includes one or more error transducers, such as error microphones 508, 510, sensing the output acoustic wave and providing respective error signals $e_1$, $e_2$. The system includes a plurality of adaptive filter channel models, such as models 512, 514, 516, and 518, each preferably provided by a least-mean-square, LMS, filter $A_{11}$, $A_{12}$, $A_{22}$, and $A_{21}$, respectively. Model 512 has a model input 520 from error transducer 508. Model 512 has an error input 522 from each of error transducers 508 and 510. Model 512 has a model output 524 outputting a correction signal to output transducer 504. Model 514 has a model input 526 from error transducer 510. Model 514 has an error input 528 from each of error transducers 508 and 510. Model 514 has a model output 530 outputting a correction signal to output transducer 504. Model 516 has a model input 532 from error transducer 510. Model 516 has an error input 534 from each of error transducers 508 and 510. Model 516 has a model output 536 outputting a correction signal to output transducer 506. Model 518 has a model input 538 from error transducer 508. Model 518 has an error input 540 from each of error transducers 508 and 510. Model 518 has a model output 542 outputting a correction signal to output transducer 506.

Summer 544 sums the correction signals from models 512 and 514 and provides an output resultant sum $y_1$ at 546. Summer 548 sums the correction signals from models 516 and 518 and provides an output resultant sum $y_2$ at 550. Summer 552 sums the output of summers 544 and 548 and provides an output resultant sum at 554. Summer 556 sums the outputs of summers 544 and 548 and provides an output resultant sum at 558. Summers 552 and 560 may be separate or common. Summer 560 sums the output of summer 552 and the error signal el from error transducer 508 and provides an output resultant sum $x_1$ at 562 to model input 520 of model 512 and also to model input 538 of model 518. Summer 564 sums the output of summer 556 and the error signal $e_2$ from error transducer 510 and provides an output resultant sum at 566 to model input 532 of model 516 and also to model input 526 of model 514.

FIG. 11 shows cross-coupling of acoustic paths of the system, including: acoustic path $P_1$ to the first error transducer 508 from the periodic noise source 502; acoustic path $P_2$ to the second error transducer 510 from source 502; acoustic path $SE_{11}$ to the first error transducer 508 from the first output transducer 504; acoustic path $SE_{21}$ to the second error transducer 510 from the first output transducer 504; acoustic path $SE_{12}$ to the first error transducer 508 from the second output transducer 506; and acoustic path $SE_{22}$ to the second error transducer 510 from the second output transducer 506. Model 512 includes a set of error path models 568, 570 of respective error paths $SE_{11}$, $SE_{21}$, which are the error paths between first output transducer 504 and each of error transducers 508 and 510. The error path models are preferably provided as above, using a random noise source as shown at 140 in FIG. 19 of incorporated U.S. Pat. No. 4,677,676, with a copy of the respective error path model provided at 568, 570, etc., as in incorporated U.S Pat. No. 4,677,676 at 144 in FIG. 19, and for which further reference may be had to the above noted Eriksson article "Development of The Filtered-U Algorithm For Active Noise Control". Alternatively, the error path may be modeled without a random noise source as in incorporated U.S. Pat. No. 4,987,598. It is preferred that the error path modeling include modeling of the transfer functions of both the speaker 504 and the acoustic path from such speaker to the error microphones. Alternatively, the SE model may include only one of such transfer functions, for example if the other transfer function is relatively constant. Further alternatively, where SE modeling is not necessary or not desired, or otherwise where the speaker or output transducer characteristics and the error path characteristics and the error transducer characteristics are relatively constant or considered unity, the SE error path models are eliminated, i.e. replaced by a unity transfer function. Error path model 568 has an input 572 from sum $x_1$, and an output 574 multiplied at multiplier 576 with error signal el. Error path model 570 has an input 578 from sum $x_1$, and an output 580 multiplied at multiplier 582 With the error signal $e_2$. The outputs of multipliers 576 and 582 are summed at summer 584 which provides an output resultant sum to error input 522 of model 512.

Model 514 includes a set of error path models 586, 588 paths $SE_{11}$, $SE_{21}$ between first output transducer 504 and each of error transducers 508, 510. Error path model 586 has an input 590 from sum $x_2$, and an output 592 multiplied at multiplier 594 with error signal el. Error path model 588 has an input 596 from sum $x_2$, and an output 598 multiplied at multiplier 600 with error signal $e_2$. The outputs of multipliers 594 and 600 are summed at summer 602 which provides an output resultant sum to error input 528 of model 514.

Model 516 includes a set of error path models 604, 606 of respective error paths $SE_{22}$, $SE_{12}$ between second output transducer 506 and each of error transducers 510, 508. Error path model 604 has an input 608 from sum $x_2$, and an output 610 multiplied at multiplier 612 with error signal $e_2$. Error path model 606 has an input from sum $x_2$, and an output 616 multiplied at multiplier 618 with error signal $e_1$. The outputs of multipliers 612 and 618 are summed at summer 620 which provides an output resultant sum to error input 534 of model 516.

Model 518 includes a set of error path models 622, 624 of respective error paths $SE_{22}$, $SE_{12}$ between output transducer 506 and each of the error transducers 510, 508. Error path model 622 has an input 626 from sum $x_1$, and an output 628 multiplied at multiplier 630 with error signal $e_2$. Error path model 624 has an input 632 from sum $x_1$, and an output 634 multiplied at multiplier 636 with error signal $e_1$. The outputs of multipliers 630 and 636 are summed at summer 638 which provides an output resultant sum to error input 540 of model 518.

Error path model 640 of error path $SE_{11}$ has an input 642 from sum $y_1$, and has an output 644 supplied to summer 552. Error path model 646 of error path $SE_{12}$ has an input 648 from sum $y_2$, and has an output 650 supplied to summer 552. Error path model 652 of error path $SE_{22}$ has an input 654 from sum $y_2$, and has an output error path $SE_{21}$ has an input 660 from sum $y_1$, and has an output 662 supplied to summer 556. The correction signals from models 512 and 514 at respective model outputs 524 and 530 are supplied through summers 544, 552 and 560 to model input 520 of model 512 and also to model input 538 of model 518. The correction signals from models 516 and 518 at respective model outputs 536 and 542 are supplied through summers 548, 556 and 564 to model input 532 of model 516 and also to model input 526 of model 514. As above noted, where SE modeling is not necessary or not desired, or otherwise where the output transducer characteristics and the error path characteristics and the error transducer characteristics are relatively constant or considered unity, the SE error path models 568, 570, 586, 588, 604, 606, 622, 624, 640, 646, 652, 658 are eliminated, i.e. replaced by a unity transfer function.

As in the above noted co-pending application, the present invention is not limited to a two channel system, but rather may be expanded to any number of channels. It is preferred that each channel have its own output transducer and error transducer, though other combinations are possible. The system is applicable to one or more output transducers, one or more error transducers, and a plurality of channel models, and at a minimum includes at least two output transducers and/or two error transducers. The system may be used with one correlated noise source or multiple correlated noise sources or one correlated noise generator driving multiple noise sources. The system includes a propagation path or environment such as defined by a duct or plant 4, though the environment is not limited thereto and may be a room, a vehicle cab, free space, etc. The system has other applications such as vibration control in structures or machines, wherein the error transducers are accelerometers for sensing the respective acoustic waves, and the output transducers are shakers for outputting canceling acoustic waves. The system can also be used to control multiple degrees of freedom of a rigid body. An exemplary application is active engine mounts in an automobile or truck for damping engine vibration. The system is also applicable to complex structures for controlling vibration. In general, the system may be used for attenuation of an undesirable elastic wave in an elastic medium, i.e. an acoustic wave propagating in an acoustic medium.

It is recognized that various equivalents, alternatives and modifications are possible within the scope of the appended claims.

I claim:

1. A multi-channel active acoustic attenuation system for attenuating a correlated input acoustic wave, comprising:

at least one output transducer introducing at least one respective canceling acoustic wave to attenuate said input acoustic wave and yield an attenuated output acoustic wave;

a plurality of error transducers sensing said output acoustic wave and providing respective error signals;

a plurality of adaptive filter channel models, each channel model having a model input from a respective said error transducer, an error input from a plurality of said error transducers, and a model output outputting a correction signal to a respective said output transducer to introduce the respective said canceling acoustic wave;

first and second error transducers, and first and second channel models, said first channel model having a model input from said first error transducer, said first channel model having an error input from each of said first and second error transducers, said first channel model having a model output, said second channel model having a model input from said second error transducer, said second channel model having an error input from each of said first and second error transducers, said second channel model having a model output summed with said model output of said first channel model to provide a resultant sum supplied as a correction signal to a respective said output transducer.

2. A multi-channel active acoustic attenuation system for attenuating a correlated input acoustic wave, comprising:

a plurality of output transducers introducing a plurality of canceling acoustic waves to attenuate said input acoustic wave and yield an attenuated output acoustic wave;

at least one error transducer sensing said output acoustic wave and providing at least one respective error signal;

a plurality of adaptive filter channel models, each channel model having a model output outputting a correction signal to a respective said output transducer to introduce the respective said canceling acoustic wave, an error input from a respective said error transducer, and a model input from a respective said error transducer and also from a model output of at least one of the remaining channel models;

first and second output transducers, and first and second channel models, said first channel model having a model output outputting a correction signal to said first output transducers, said first channel model having an error input from the respective said error transducer, said first channel model having a model input from the respective said error transducer and also from the model output of said first channel model and also from the model output of said second channel model, said second channel model having a model output outputting a correction signal to said second output transducer, said second channel model having an error input from the respective said error transducer, said second channel model having a model input from the respective said error transducer and also from the model output of said second channel model and also from the model output of said first channel model.

3. A multi-channel active acoustic attenuation system for attenuating a correlated input acoustic wave, comprising:

first and second output transducers introducing first and second canceling acoustic waves to attenuate said input acoustic wave and yield an attenuated output acoustic wave;

first and second error transducers sensing said output acoustic wave and providing first and second error signals;

a first adaptive filter channel model having a model input from said first error transducer, an error input from each of said first and second error transducers, and a model output outputting a correction signal to said first output transducer;

a second adaptive filter channel model having a model input from said second error transducer, an error input from each of said first and second error transducers, and a model output outputting a correction signal to said first output transducer;

a third adaptive filter channel model having a model input from said second error transducer, an error input from each of said first and second error transducers, and a model output outputting a correction signal to said second output transducer;

a fourth adaptive filter channel model having a model input from said first error transducer, an error input from each of said first and second error transducers, and a model output outputting a correction signal to said second output transducer.

4. The system according to claim 3 wherein:

said correction signals from said first and second channel models are supplied to each of said model inputs of said first, second, third and fourth channel models;

said correction signals from said third and fourth channel models are supplied to each of said model inputs of said first, second, third and fourth channel models.

5. The system according to claim 3 comprising:

a first summer summing said correction signals from said first and second channel models and providing an output resultant sum;

a second summer summing said correction signals from said third and fourth channel models and providing an output resultant sum;

a third summer summing the outputs of said first and second summers and providing an output resultant sum;

a fourth summer summing the outputs of said first and second summers and providing an output resultant sum;

a fifth summer summing the output of said third summer and the output of said first error transducer and providing an output resultant sum to said model input of said first channel model and also to said model input of said fourth channel model;

a sixth summer summing the output of said fourth summer and the output of said second error transducer and providing an output resultant sum to said model input of said third channel model and also to said model input of said second channel model.

6. The system according to claim 5 wherein:

said first channel model comprises a first set of error path models of error paths between said first output transducer and each of said first and second error transducers, said first set comprising a first error path model having an input from said first error transducer, said first error path model having an output multiplied at a first multiplier with the output of said first error transducer, said first set comprising a second error path model having an input from said first error transducer, said second error path model having an output multiplied at a second multiplier with the output of said second error transducer, the outputs of said first and second multipliers being summed at a seventh summer providing an output resultant sum to said error input of said first channel model;

said second channel model comprises a second set of error path models of error paths between said first output transducer and each of said first and second error transducers, said second set comprising a third error path model having an input from said second error transducer, said third error path model having an output multiplied at a third multiplier with the output of said first error transducer, said second set comprising a fourth error path model having an input from said second error transducer, said fourth error path model having an output multiplied at a fourth multiplier with the output of said second error transducer, the outputs of said third and fourth multipliers being summed at an eighth summer providing an output resultant sum to said error input of said second channel model;

said third channel model comprises a third set of error path models of error paths between said second output transducer and each of said first and second error transducers, said third set comprising a fifth error path model having an input from said second error transducer, said fifth error path model having an output multiplied at a fifth multiplier with the output of said second error transducer, said third set comprising a sixth error path model having an input from said second error transducer, said sixth error path model having an output multiplied at a sixth multiplier with the output of said first error transducer, the outputs of said fifth and sixth multipliers being summed at a ninth summer providing an output resultant sum to said error input of said third channel model;

said fourth channel model comprises a fourth set of error path models of error paths between said second output transducer and each of said first and second error transducers, said fourth set comprising a seventh error path model having an input from said first error transducer, said seventh error path model having an output multiplied at a seventh multiplier with the output of said second error transducer, said fourth set comprising an eighth error path model having an input from said first error transducer, said eighth error path model having an output multiplied at an eighth multiplier with the output of said first error transducer, the outputs of said seventh and eighth multipliers being summed at a tenth summer providing an output resultant sum to said error input of said fourth channel model;

and comprising:

a ninth error path model having an input from the output of said first summer, said ninth error path model having an output supplied to said third summer;

a tenth error path model having an input from the output of said second summer, said tenth error path model having an output supplied to said third summer;

an eleventh error path model having an input from the output of said second summer, said eleventh error path model having an output supplied to said fourth summer;

a twelfth error path model having an input from the output of said first summer, said twelfth error path model having an output supplied to said fourth summer.

7. A multi-channel active acoustic attenuation method for attenuating a correlated input acoustic wave, comprising:

introducing at least one canceling acoustic wave from at least one respective output transducer to attenuate said input acoustic wave and yield an attenuated output acoustic wave;

sensing said output acoustic wave with a plurality of error transducers and providing respective error signals;

providing a plurality of adaptive filter channel models, providing each channel model with a model input from a respective said error transducer, providing each channel model with an error input from a plurality of error transducers, and providing each channel model with a model output outputting a correction signal to a respective said output transducer to introduce the respective said canceling acoustic wave;

providing first and second error transducers, said first and second channel models, providing said first channel model with a model input from said first error transducer, providing said first channel model with an error input from each of said first and second error transducers, providing said first channel model with a model output, providing said second channel model with a model input from said second error transducer, providing said second channel model with an error input from each of said first and second error transducers, providing said second channel model with a model output, summing said model output of said second channel model with said model output of said first channel model and supplying the resultant sum as a correction signal to a respective said output transducer.

8. A multi-channel active acoustic wave, comprising:

introducing a plurality of canceling acoustic waves for attenuating a correlated input acoustic wave, comprising:

introducing a plurality of canceling acoustic waves from a plurality of output transducers to attenuate said input acoustic wave and yield an attenuated output acoustic wave;

sensing said output acoustic wave with at least one error transducer and providing at least one respective error signal;

providing a plurality of adaptive filter channel models, providing each channel model with a model output outputting a correction signal to a respective said output transducer to introduce the respective said canceling acoustic wave, providing each channel model with an error input from a respective said error transducer, and providing each channel model with a model input from a respective said error transducer and also from a model output of at least one of the remaining channel models;

providing first and second output transducers, and first and second channel models, providing said first channel model with a model output outputting a correction signal to said first output transducer, providing said first channel model with an error input from the respective said error transducer, providing said first channel model with a model input from the respective said error transducer and also from the model output of said first channel model and also from the model output of said second channel model, providing said second channel model with a model output outputting a correction signal to said second output transducer, providing said second channel model with an error input from the respective said error transducer, providing said second channel model with a model input from the respective said error transducer and also from the model output of the second channel model and also from the model output of said first channel model.

9. A multi-channel active acoustic attenuating method for attenuating a correlated input acoustic wave, comprising:

introducing first and second canceling acoustic waves from first and second output transducers to attenuate said input acoustic wave and yield an attenuated output acoustic wave;

sensing said output acoustic wave with first and second error transducers and providing first and second error signals;

providing a first adaptive filter channel model, providing said first channel model with a model input from said first error transducer, providing said first channel model with an error input from each of said first and second error transducers, providing said first channel model with a model output and outputting a correction signal to said first output transducer;

providing a second adaptive filter channel model, providing said second channel model with a model input from said second error transducer, providing said second channel model with an error input from each of said first and second error transducers, providing said second channel model with a model output and outputting a correction signal to said first output transducer;

providing a third adaptive filter channel model, providing said third channel model with a model input from said second error transducer, providing said third channel model with an error input from each of said first and second error transducers, providing said third channel model with a model output and outputting a correction signal to said second output transducer;

providing a fourth adaptive filter channel model, providing said fourth channel model with a model input from said first error transducer, providing said fourth channel model with an error input from each of said first and second error transducers, providing said fourth channel model with a model output and outputting a correction signal to said second output transducer.

10. The method according to claim 9 comprising:

supplying said correction signals from said first and second channel models to each of said model inputs of said first, second, third and fourth channel models;

supplying said correction signals from said third and fourth channel models to each of said model inputs of said first, second, third and fourth channel models.

11. The method according to claim 9 comprising:

summing said correction signals from said first and second channel models at a first summer and providing an output resultant sum;

summing said correction signals from said third and fourth channel models at a second summer and providing an output resultant sum;

summing the outputs of said first and second summers at a third summer and providing an output resultant sum;

summing the outputs of said first and second summers at a fourth summer and providing an output resultant sum;

summing the output of said third summer and the output of said first error transducer at a fifth summer and providing an output resultant sum to said model input of said first channel model and also to said model input of said fourth channel model;

summing the output of said fourth summer and the output of said second error transducer at a sixth summer and providing an output resultant sum to said model input of said third channel model and also to said model input of said second channel model.

12. The method according to claim 11 comprising:

providing said first channel model with a first set of error path models of error paths between said first output transducer and each of said first and second error transducers, providing said first set with a first error path model, providing said first error path model with an input from said first error transducer, providing said first error path model with an output, multiplying the output of said first error path model and the output of said first error transducer at a first multiplier, providing said first set with a second error path model, providing said second error path model with an input from said first error transducer, providing said second error path model with an output, multiplying the output of said second error path model and the output of said second error transducer at a second multiplier, summing the outputs of said first and second multipliers at a seventh summer and providing an output resultant sum to said error input of said first channel model;

providing said second channel model with a second set of error path models of error paths between said first output transducer and each of said first and second error transducers, providing said second set with a third error path model, providing said third error path model with an input from said second error transducer, providing said third error path model with an output, multiplying the output of said third error path model and the output of said first error transducer at a third multiplier, providing said second set with a fourth error path model, providing said fourth error path model with an input from said second error transducer, providing said fourth error path model with an output, multiplying the output of said fourth error path model with the output of said second error transducer at a fourth multiplier, summing the outputs of said third and fourth multipliers at an eighth summer and providing an output resultant sum to said error input of said second channel model;

providing said third channel model with a third set of error path models of error paths between said second output transducer and each of said first and second error transducers, providing said third set with a fifth error path model, providing said fifth error path model with an input from said second error transducer, providing said fifth error path model with an output, multiplying the output of said fifth error path model and the output of said second error transducer at a fifth multiplier, providing said third set with a sixth error path model, providing said sixth error path model with an input from said second error transducer, providing said sixth error path model with an output, multiplying the output of said sixth error path model and the output of said first error transducer at a sixth multiplier, summing the outputs of said fifth and sixth multipliers at a ninth summer and providing an output resultant sum to said error input of said third channel model;

providing said fourth channel fourth set of error path models of error paths between said second output transducer and each of said first and second error transducers, providing said fourth set with a seventh error path model having an input from said first error transducer, providing said seventh error path model with an output, multiplying the output of said seventh error path model and the output of said second error transducer at a seventh multiplier, providing said fourth set with an eighth error path model, providing said eighth error path model with an input from said first error transducer, providing said eighth error path model with an output, multiplying the output of said eighth error path model and the output of said first error transducer at an eighth multiplier, summing the outputs of said seventh and eighth multipliers and providing an output resultant sum to said error input of said fourth channel model;

providing a ninth error path model having an input and an output, supplying the output of said first summer to the input of said ninth error path model, supplying the output of said ninth error path model to said third summer;

providing a tenth error path model having an input and an output, supplying the output of said second summer to the input of said tenth error path model, supplying the output of said tenth error path model to said third summer;

providing an eleventh error path model having an input and an output, supplying the output of said second summer to the input of said eleventh error path model, supplying the output of said eleventh error path model to said fourth summer;

providing a twelfth error path model having an input and an output, supplying the output first summer to the input of said twelfth error path model, supplying the output of said twelfth error path model to said fourth summer.

* * * * *

UNITED STATES PATENT AND TRADEMARK OFFICE

CERTIFICATE OF CORRECTION

PATENT NO. : 5,216,722

DATED : June 1, 1993

INVENTOR(S) : Steven R. Popovich

It is certified that error appears in the above-identified patent and that said Letters Patent is hereby corrected as shown below:

Claim 7, col. 22, line 65, delete "said" and substitute therefor -- and --; Claim 8, col. 23, line 13, after "acoustic" insert -- attenuation method for attenuating a correlated input acoustic --; Claim 8, col. 23, lines 13-16, delete "introducing a plurality of canceling acoustic waves for attenuating a correlated input acoustic wave, comprising:"; CLAIM 12, col. 26, line 43, after "output" (2nd occurrence) insert -- of said --.

Signed and Sealed this

First Day of February, 1994

*Attest:*

Bruce Lehman

BRUCE LEHMAN

*Attesting Officer*

*Commissioner of Patents and Trademarks*